(12) United States Patent
Schaefer

(10) Patent No.: US 7,411,857 B2
(45) Date of Patent: *Aug. 12, 2008

(54) POWER SAVINGS IN ACTIVE STANDBY MODE

(75) Inventor: Scott Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 26 days.

This patent is subject to a terminal disclaimer.

(21) Appl. No.: 11/516,848

(22) Filed: Sep. 7, 2006

(65) Prior Publication Data

US 2007/0002663 A1 Jan. 4, 2007

Related U.S. Application Data

(60) Division of application No. 11/175,544, filed on Jul. 6, 2005, now Pat. No. 7,277,333, which is a continuation of application No. 10/227,994, filed on Aug. 26, 2002, now Pat. No. 6,930,949.

(51) Int. Cl.
*G11C 5/14* (2006.01)

(52) U.S. Cl. .................. 365/227; 365/194; 713/320

(58) Field of Classification Search .............. 365/228, 365/229
See application file for complete search history.

(56) References Cited

U.S. PATENT DOCUMENTS

| | | | |
|---|---|---|---|
| 5,337,285 A * | 8/1994 | Ware et al. ............. 365/227 |
| 5,402,389 A | 3/1995 | Flanagan et al. |
| 5,768,177 A | 6/1998 | Sakuragi |
| 5,786,686 A | 7/1998 | Ohtake |
| 5,896,347 A | 4/1999 | Tomita et al. |
| 5,959,471 A | 9/1999 | Weinfurtner |
| 6,101,144 A | 8/2000 | Jo |
| 6,212,127 B1 | 4/2001 | Funaba et al. |
| 6,249,473 B1 | 6/2001 | Lau et al. |
| 6,278,654 B1 * | 8/2001 | Roohparvar ............. 365/238.5 |
| 6,438,060 B1 | 8/2002 | Li et al. |
| 6,456,560 B2 | 9/2002 | Arimoto et al. |
| 6,525,988 B2 | 2/2003 | Ryu et al. |
| 6,687,185 B1 | 2/2004 | Keeth et al. |
| 6,781,911 B2 | 8/2004 | Riesenman et al. |
| 6,930,949 B2 * | 8/2005 | Schaefer ................ 365/227 |
| 6,937,534 B2 | 8/2005 | Lim et al. |
| 6,967,893 B2 | 11/2005 | Heyne |
| 7,180,791 B2 * | 2/2007 | Roohparvar ........... 365/189.02 |
| 7,277,333 B2 * | 10/2007 | Schaefer ................ 365/194 |

OTHER PUBLICATIONS

Micron Technology, Inc., Technical Note, TN-46-03, "Calculating Memory System Power for DDR", 2001, pp. 1-15.

* cited by examiner

*Primary Examiner*—Tan T. Nguyen
(74) *Attorney, Agent, or Firm*—Leffert Jay & Polglaze, P.A.

(57) ABSTRACT

Apparatus for reducing the power consumed by a memory device selectively activates a power saving mode in which operation of a delay compensation circuit may be suspended during an active power down mode of operation.

17 Claims, 5 Drawing Sheets

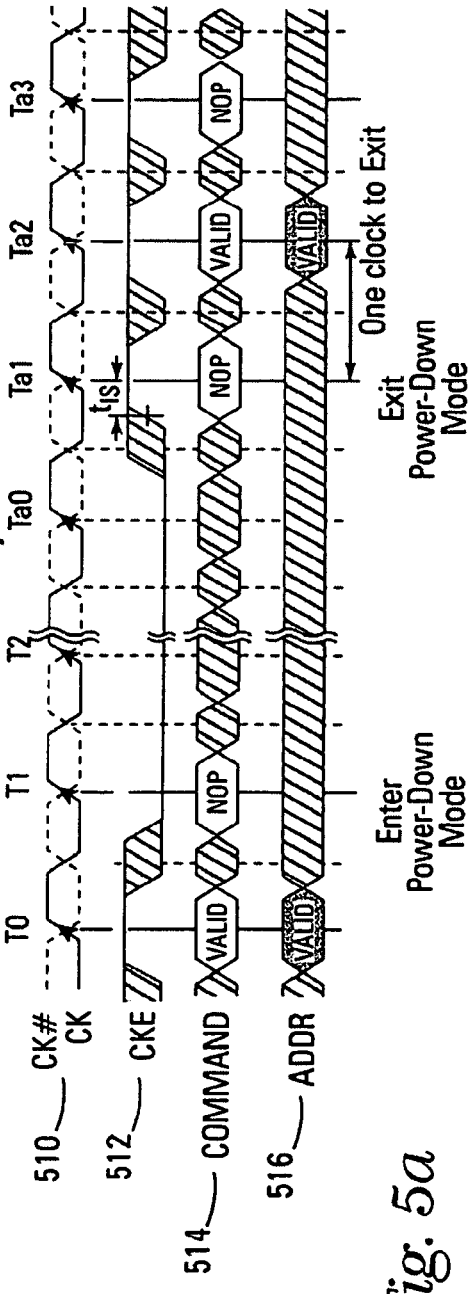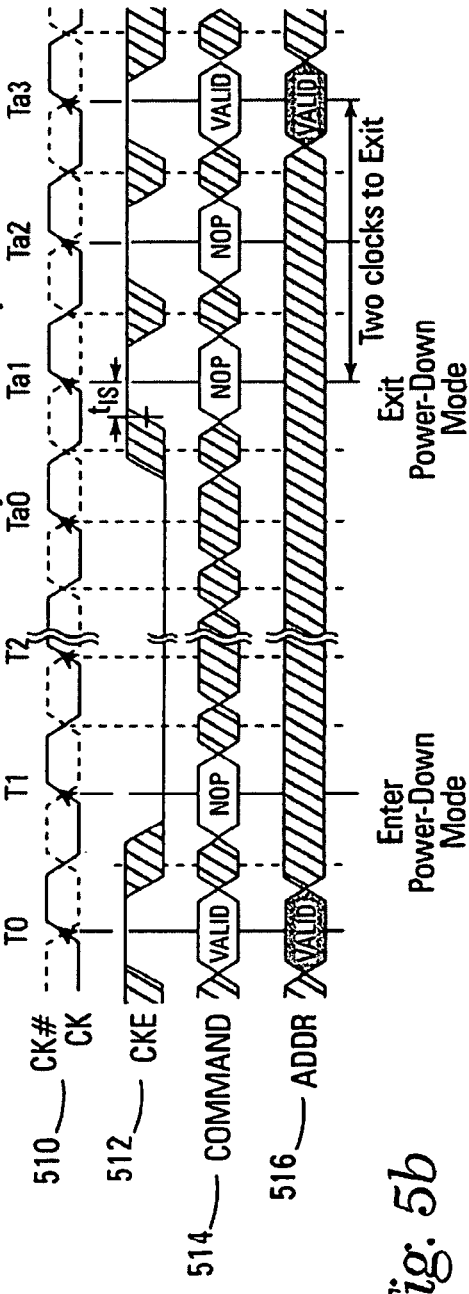

POWER SAVINGS IN ACTIVE STANDBY MODE

RELATED APPLICATIONS

This application is a divisional of U.S. patent application Ser. No. 11/175,544 now U.S. Pat. No. 7,277,333, filed Jul. 6, 2005 and titled "POWER SAVINGS IN ACTIVE STANDBY MODE," which application is a continuation of U.S. patent application Ser. No. 10/227,994 filed Aug. 26, 2002, now U.S. Pat. No. 6,930,949, each of which is commonly assigned and incorporated by reference in their entirety herein.

TECHNICAL FIELD

The present invention is related in general to dynamic random access memory devices and more particularly to a method and apparatus for achieving power savings in random access memory devices when the memory device is in a standby or power-down mode of operation.

BACKGROUND INFORMATION

The invention of the present application will be illustrated with respect to double data rate synchronous dynamic random access memory (DDR), however, as will be understood by those of ordinary skill in the art, the invention is also applicable to other types of random access memories, in particular, those that utilize one or more delay compensation circuits such as, for example, one or more delay locked loops (DLLs).

A DDR memory essentially doubles the speed capabilities of standard synchronous dynamic random access memory (SDRAM) without increasing the external clock frequency. It does so by enabling the transfer of data on both the rising and falling edges of the external clock. With the increase in speed, timing and synchronization tolerances are correspondingly tighter.

In a purely synchronous memory, data transfer is referenced directly to a free-running external clock. However, as transfer speeds increase data cannot be launched in time for the data outputs (DQs) to capture the data in the data valid window, i.e., the period of time during which the data lines are certain to be in the correct logic state. Although the clock can be offset for early data launch and/or late data capture by adding or subtracting delay elements, these techniques do not account for variable movement of the data valid window relative to a fixed clock signal due, for example, to changes in temperature, voltage, process variables, and loading conditions. A delay compensation circuit such as a delay locked loop (DLL) or calibrated delay line can effectively compensate for such variations and place the data valid window with greater precision with respect to the external clock. A delay compensation circuit typically includes a relatively large number of delay logic gates that toggle or transition with each transition of the external clock. Power is consumed when the gates transition. The delay compensation circuit is not needed when the memory is in a standby mode and data is not being transferred. Unfortunately, once the delay compensation circuit is powered down it takes a large number of clock cycles, as many as 200, for example, to resynchronize or recalibrate the delay. In some standby modes of operation, such as in the active power-down mode, the time it takes to resynchronize or recalibrate the delay compensation circuit after a power-down is not acceptable.

The above-mentioned concerns are addressed by the present invention and will be understood by reading and studying the following specification.

BRIEF DESCRIPTION OF THE DRAWINGS

FIGS. 5a and 5b are timing diagrams comparing two power-down modes of operation according to the teachings of the present invention.

DETAILED DESCRIPTION

In the following detailed description of the preferred embodiments, reference is made to the accompanying drawings that form a part hereof, and in which are shown by way of illustration specific embodiments in which the invention may be practiced. It is to be understood that other embodiments may be utilized and structural and/or design changes may be made without departing from the scope of the present invention.

Figure 1:
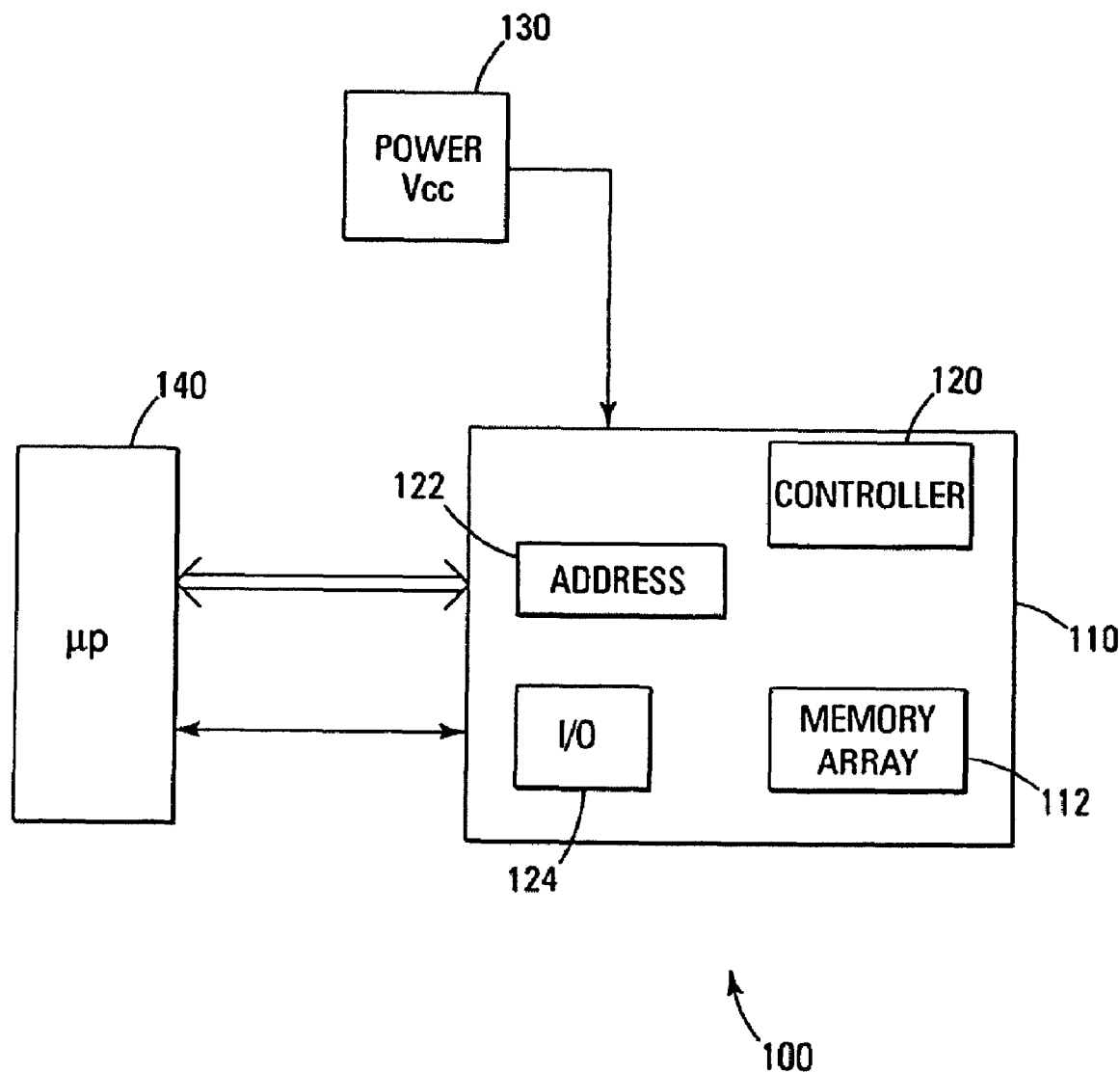
FIG. 1 shows a block diagram of a DRAM memory circuit coupled to a system including a processor.

FIG. 1 shows a computer system 100 including a memory circuit 110, a power supply 130 and a processor 140 of an embodiment of the present invention. Memory 110 includes a memory array 112 of memory cells (which can be synchronous DDR memory), and a controller 120 that controls detailed operations of memory 110 such as the various individual steps necessary for carrying out writing, reading, and erasing operations and may also include delay calibration, compensation and control functions, an extended mode register (EMR) and other status and control registers. Memory 10 also includes an address decoder circuit 122 for decoding and selecting addresses provided by processor 140 to access appropriate memory cells in memory array 112, and an I/O circuit 124 for providing bi-directional communications between processor 140 and memory circuit 110.

Figure 2:
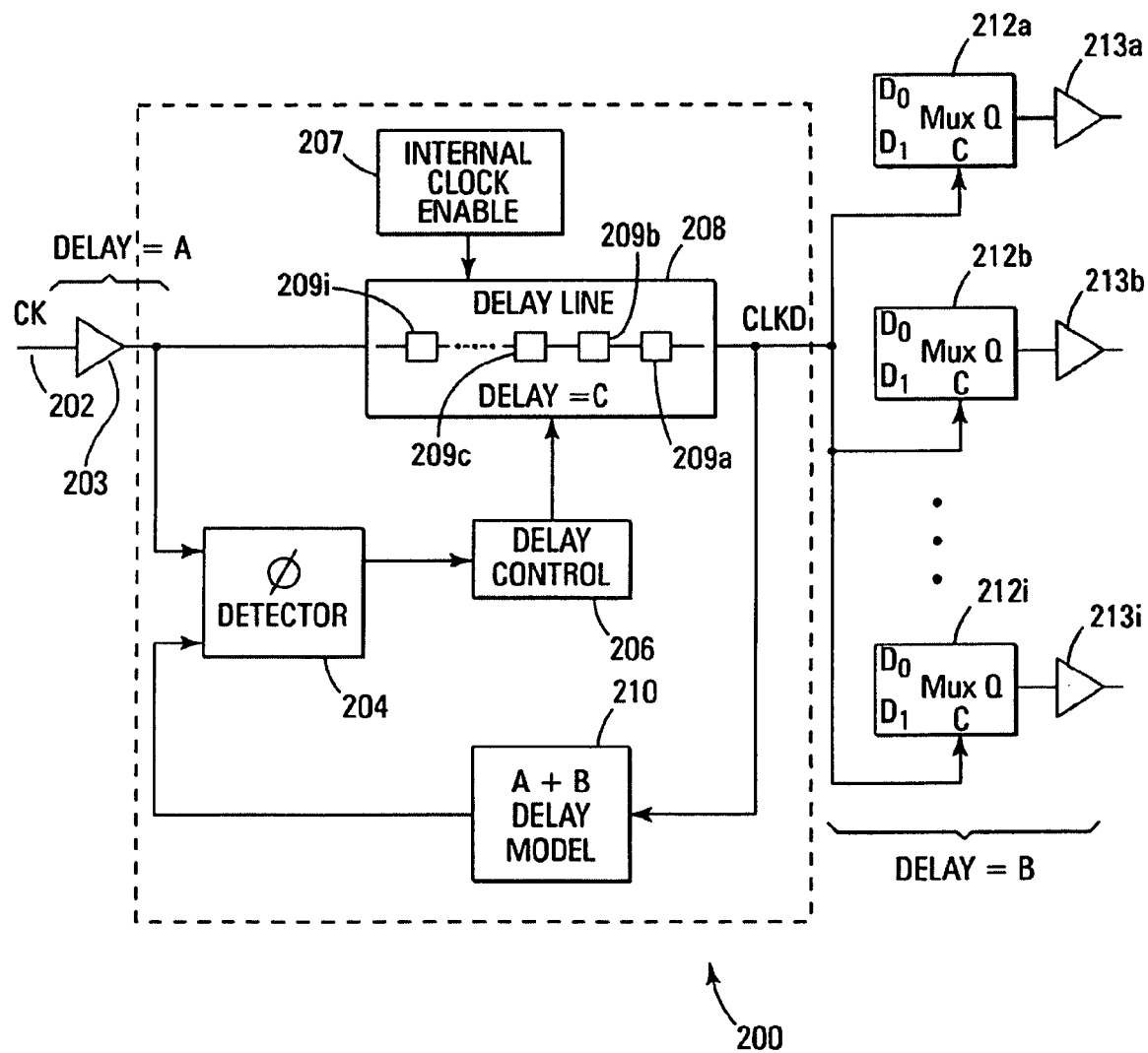
FIG. 2 is an illustration of one example of a circuit according to the teachings of the present invention.

FIG. 2 shows a simplified block diagram of an example of a delay compensation circuit for use in a DDR memory. In this example, external clock 202 is input to DLL 200 through delay model element 203. Delay model element 203 represents the propagation delay through any circuit elements such as a clock input buffer that may exist between the external clock and DLL 200. DLL 200 provides the external clock 202 to phase detector 204 and to delay line 208. Delay line 208 includes a number of delay elements $209_a$ to $209_i$ controllable by delay control 206. Delay control 206 provides a control signal for adjusting the delay of delay line 208. Delay control 206 responds to a signal from phase detector 204. The signal output from phase detector 204 varies in proportion to a phase difference between the external clock and the output of A+B delay model 210. CLKD, the output of delay line 208, is provided to DQ buffer $212_a$ to $212_i$ and is also fed back to A+B delay model 210. Delay line 208 is thus controlled to compensate for and continuously adjust for the propagation delay of data through the memory so that data is launched during the data valid window.

Internal clock enable 207 selectively switches on and off the external clock signal that toggles the delay elements $209_a$ to $209_i$ to effect a power saving mode of the present invention.

Figure 3:
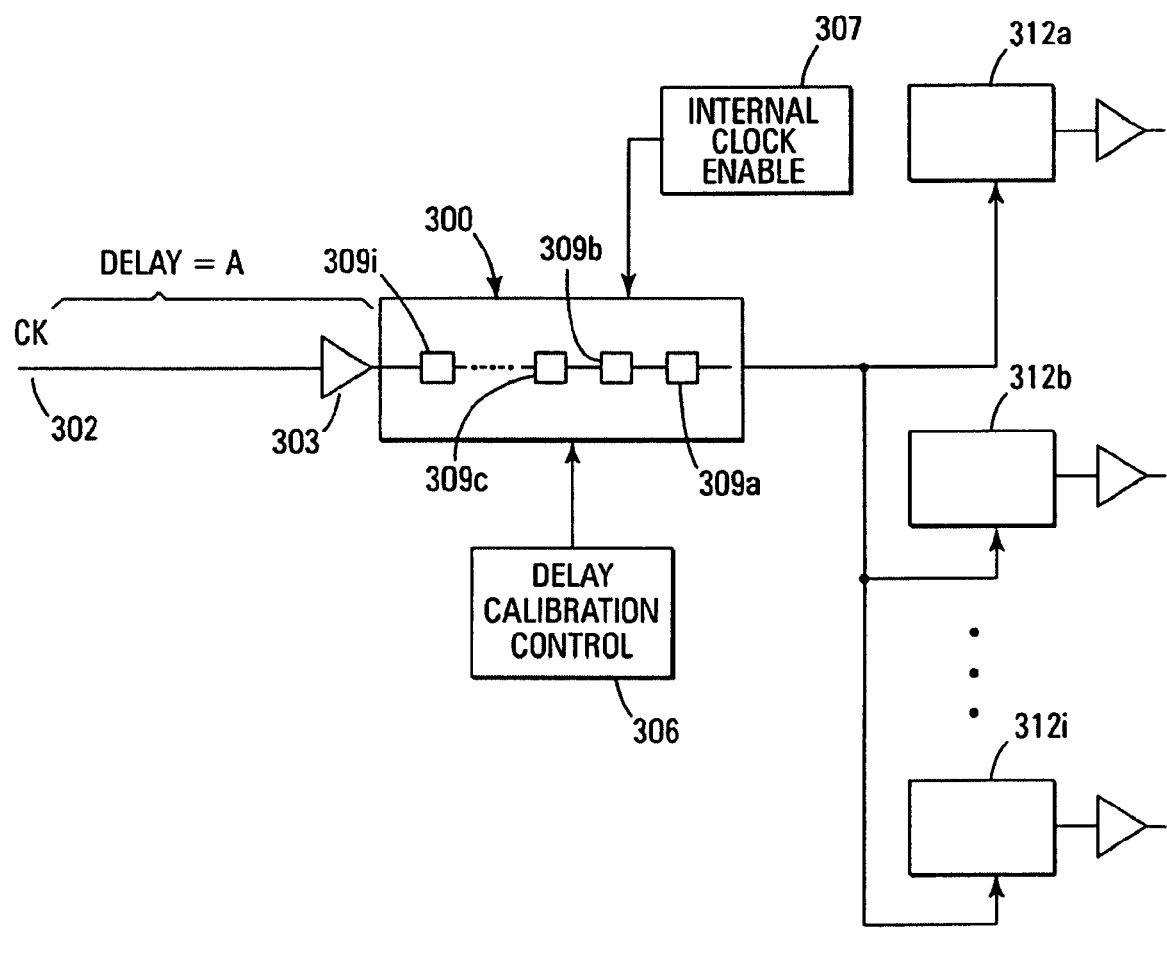
FIG. 3 is an illustration of one additional example of a circuit according to the teachings of the present invention.

FIG. 3 shows one other example of a simplified block diagram of a delay compensation circuit for use in a DDR memory, according to the present invention. In FIG. 3, external clock 302 is input through delay model element 303

(representing the propagation delay through any intervening circuit elements) to delay 300 made up of a string of identical delay elements $309_a$ through $309_i$. Delay elements $309_a$ through $309_i$ compensate for the propagation delay through any circuit elements such as a clock input buffer, between the external clock and delay line 300 as well as the delay from the DQ buffers $312_a$ to $312_i$ as in the example of FIG. 2. In this example, however, a calibration control 306 adjusts the delay by controlling the number of delay elements $309_a$ to $309_i$ in the signal path to compensate for signal propagation variations. Calibration control 306 is a control element that may be implemented on a digital signal processor or other digital or analog processor as would be familiar to those of ordinary skill in the art. Calibration control 306 may periodically calibrate delay line 300 to adjust or compensate for any variations in propagation delay or may recalibrate delay line 300 whenever variations in propagation delay exceed predetermined limits. The output of delay 300 is provided to DQ buffers $312_a$ to $312_i$. Internal clock enable 307 selectively switches on and off the clock signal to elements of delay 300 to effect the power saving mode of the present invention as described below.

In any practical effort to achieve power savings in DRAM devices the improvement should be backwards compatible. The approach of the present invention enables significant DRAM power savings in an active standby mode and is fully backwards compatible so that it can be used in connection with Joint Electronic Devices Engineering Council (JEDEC) compliant devices and in designs that are already established in the marketplace.

In a typical DRAM, the clock enable (CKE) signal is used to place the device in a power-down or standby state. For example, power-down will occur if CKE is registered LOW coincident with a NOP (no operation) or command inhibit instruction when no memory accesses are in progress. If power-down occurs when all banks are idle, this mode is referred to as "precharge power-down;" if power-down occurs when there is a row active in any memory bank, this mode is referred to as "active power-down." The current consumed during the power-down states depends on whether the memory is in a precharge power-down or an active power-down mode of operation. IDD2P, a parameter recognized in the industry, refers to the current consumed during a precharge power-down. During a precharge power-down, a typical 4 bank memory device requires approximately 3-5 mA of current, i.e., IDD2P is approximately 3-5 mA. IDD3P refers to the current consumed in active power-down when at least one of the memory banks is in an active mode. IDD3P is typically 20 mA in an active power-down mode. Running of the delay compensation circuit during active power-down mode is a principal reason for the additional power consumption.

One solution that has been proposed to the problem of minimizing the power consumed while a memory device is in power-down or standby mode involves freezing or interrupting the transitions of the delay gates of the delay compensation circuit. An example of this approach is discussed in commonly assigned U.S. patent application Ser. No. 09/780,606, entitled "METHOD OF REDUCING STANDBY CURRENT DURING POWER DOWN MODE," filed Feb. 12, 2001, issued Aug. 20, 2002 as U.S. Pat. No. 6,438,060, and incorporated herein by reference as if fully set forth (hereinafter referred to as the '606 application).

As noted, a complete power-down of a DLL or other delay compensation circuit during a power-down mode is impractical due to the number of cycles needed to resynchronize or recalibrate the circuit with the clock when it is restarted. The '606 application discusses suspending or freezing the delay elements of a DLL delay compensation circuit by operating a switch to prevent the external clock signal from reaching the DLL during a power-down mode of operation. According to the present JEDEC standards for DRAMs, when a device exits standby mode it must take only one clock cycle to make the transition. However, in order to reactivate a suspended DLL or other clocked delay-line-based delay compensation circuit by reintroducing the clock signal prior to exiting active standby mode, more than one clock cycle is needed for reliability. This unfortunately conflicts with the JEDEC standard. In many cases compliance with the JEDEC clock requirement may not be as important to designers as achieving power savings in active power-down mode, however, device manufacturers are generally reluctant to manufacture non-JEDEC compliant (or other non-standard) DRAMs. If it is possible in a given application or design to allow for more than one clock cycle on exit of an active power-down mode, then, according to be present invention, power consumption may be reduced from the typical 20 mA per device to about 3 to 5 mA. For applications requiring perhaps 500 devices, significant power savings may be achieved.

According to one aspect of the present invention, an active standby power savings mode of operation may be provided as an optional programmable feature so that in the default mode, the device will be backwards compatible with the JEDEC standard and achieve additional power savings in a selectable power savings mode. By providing an active standby power savings mode of operation as a selectable option, users of the device can write program code to exit power-down mode in more than one clock cycle if design constraints permit, or exit power-down mode in one clock transition if compliance with the a JEDEC requirement or other standard is necessary. In other words, users of a fully backwards-compliant device can elect to achieve significant power savings in the active standby mode of a given design if it is possible to program the exit from standby mode with more than one clock cycle.

In one example of the present invention, a register or other storage element may be programmed to select either the default (JEDEC compatible) single clock delay to exit standby mode (a "0," for example), or greater than one clock delay power savings mode (a "1," for example).

In other example of the present invention, the power savings mode may be identified and/or selected for a particular part by means of serial presence detect (SPD) settings. The SPD is typically a small non-volatile memory chip such as an electrically erasable programmable read-only memory located on a memory device or module and contains all of the necessary specifications of the memory including speed settings, attributes, parameters like width, a manufacturers code, clock settings, and the like. The SPD enables an operating system to read the specifications of the memory on boot-up and then adjust the memory timing parameters accordingly. The SPD chip may then be queried for information about the settings so that adjustments can be made in other devices and operations to work with the DRAM.

Figure 4:
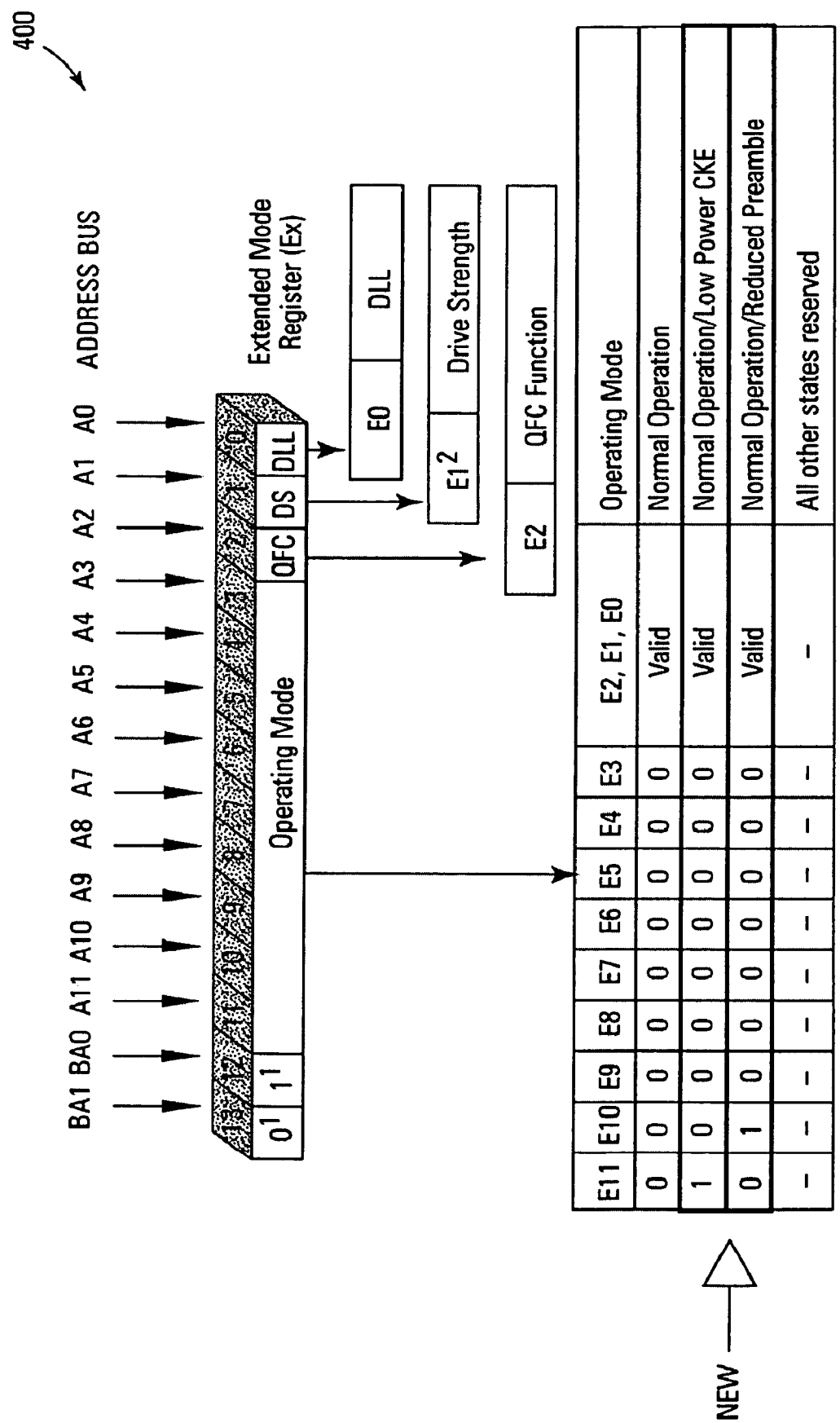
FIG. 4 is an illustration of an extended mode register to select power-down modes of operation according to the teachings of the present invention.

FIG. 4 shows one example of a storage element that may be used for storing power savings modes of operation in connection with the present invention. In this example, an extended mode register (EMR) 400 is used as the storage element. EMR 300 may be part of a memory controller or other control device that provides control signals to the delay compensation circuit of the present invention. EMR 300 includes a number of bits for setting the operating mode of the DRAM. In one example, bit $E_{11}$ may be used to select between the single clock delay exit and the more than one clock delay exit power savings mode. As shown in FIG. 3, if $E_{11}$ is "1," a more than one clock delay (two clock cycle, for example) will be used to exit the active power-down mode. If $E_{11}$ is "0," exiting the active power-down mode will take place in one clock. In this way, the DRAM device may be placed in the backwards compatible one clock exit mode or the more than one clock power saving mode if design constraints permit.

FIGS. 5a and 5b show examples of timing diagrams of programmable active power-down exit modes according to the present invention. External clock 510 is a free running periodic double-sided clock signal. Both sides of the clock CK and CK# are shown (the dashed line is CK#) to illustrate that both positive and negative sides of the clock cycles are used in DDR memory. Clock enable (CKE) 512 determines when the memory is placed in a power-down mode. When CKE 512 is low the memory will enter the power down mode on the next positive transition of CK 510, assuming a NOP or no command is present on command line 514. As FIG. 5a shows, the DRAM will exit power-down mode in one clock cycle when CKE 512 is again high on the next CK 510 transition high thus maintaining compliance with the JEDEC standards.

FIG. 5b shows the timing of a DRAM according to the present invention when a power saving active power-down mode of operation has been selected. As in the case of the non-power saving mode shown in FIG. 5a clock enable (CKE) 512 determines when the memory is placed in a power-down mode. When CKE 512 is low the memory will enter the power down mode on the next positive transition of CK 510, again assuming a NOP or no command is present on command line 514. The DRAM will exit power-down mode in two CK 510 cycles, or sooner. When the first CK 510 transition occurs internal clock enable 207 (or 307) will transition to supply CK 510 to the delay line 208 (or 300). Finally, as ADDR 516 shows, two clock cycle are used in this example to exit in the power savings mode of FIG. 5b compared with the one clock transition for the normal CKE Power-Down exit mode of FIG. 5a.

CONCLUSION

A method and apparatus for conserving power in active power down mode of a dynamic random access memory includes a circuit that enables the selection or programming of a power saving mode that involves exiting the active power down mode of operation more than one clock cycle. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A computer system, comprising:
   a processor; and
   a memory device coupled to the processor, wherein the memory device comprises:
      a circuit to enable selection of a first power saving mode of operation for the memory device, the first power savings mode comprising exiting an active power-down mode of operation of the memory device in more than one clock cycle.

2. The computer system of claim 1, wherein the power savings mode comprises exiting the active power-down mode of operation in two clock cycles.

3. The computer system of claim 1, wherein the memory device is further adapted to permit exiting the active power-down mode of operation in only one clock cycle.

4. A computer system, comprising:
   a processor; and
   a memory device coupled to the processor, wherein the memory device comprises:
      a circuit to enable selection of a first power saving mode of operation for the memory device, the first power savings mode comprising exiting an active power-down mode of operation of the memory device in two clock cycles;
      wherein the memory device is configured to enable selection of a second power saving mode to permit exiting the active power-down mode of operation in only one clock cycle.

5. A memory device, comprising:
   a controller for controlling operations of the memory device, wherein the controller is adapted to permit transitioning from an active power-down mode of operation of the memory device to a normal mode of operation by suspending operation of a delay compensation circuit during the active power-down mode of operation and providing more than one clock cycle to exit the power-down mode of operation.

6. The memory device of claim 5, wherein suspending operation of the delay compensation circuit takes place without powering down the delay compensation circuit.

7. The memory device of claim 6, wherein the delay compensation circuit comprises one or more delay locked loops.

8. The memory device of claim 5, wherein suspending operation of the delay compensation circuit comprises disengaging one or more delay elements of the delay compensation circuit from a clock signal.

9. The memory device of claim 5, wherein the controller is further adapted to permit exiting the active power-down mode of operation in only one clock cycle.

10. A memory device, comprising:
    a controller for controlling operations of the memory device, wherein the controller is adapted to permit transitioning from an active power-down mode of operation of the memory device to a normal mode of operation by suspending operation of a delay compensation circuit during the active power-down mode of operation and providing more than one clock cycle to exit the power-down mode of operation;
    wherein the controller is further adapted to permit exiting the active power-down mode of operation in only one clock cycle.

11. The memory device of claim 10, wherein suspending operation of the delay compensation circuit takes place without powering down the delay compensation circuit.

12. The memory device of claim 11, wherein the delay compensation circuit comprises one or more delay locked loops.

13. The memory device of claim 10, wherein suspending operation of the delay compensation circuit comprises disengaging one or more delay elements of the delay compensation circuit from a clock signal.

14. A memory device, comprising:
    a controller for controlling operations of the memory device, wherein the controller is adapted to perform two modes of operation for enabling the conservation of power in a power-down mode of operation of the memory device, wherein the modes comprise:
       a first active power-down mode of operation, wherein suspending operation of a delay locked loop during the first active power-down mode of operation is permitted by allowing more than one clock cycle to exit the first active power-down mode of operation; and a second active power-down mode of operation, wherein suspending operation of the delay locked loop during the second active power-down mode of operation is not permitted by allowing only one clock cycle to exit the second active power-down mode of operation.

15. The memory device of claim 14, wherein the second active power-down mode of operation is in compliance with an industry wide standard.

16. The memory device of claim 14, wherein one of the first or second active power-down modes of operation is selected by programming a register.

17. A memory device, comprising:
a controller for controlling operations of the memory device, wherein the controller is adapted to perform two modes of operation for enabling the conservation of power in a power-down mode of operation of the memory device, wherein the modes comprise:

a first active power-down mode of operation, wherein suspending operation of a delay locked loop during the first active power-down mode of operation is permitted by allowing more than one clock cycle to exit the first active power-down mode of operation; and a second active power-down mode of operation, wherein suspending operation of the delay locked loop during the second active power-down mode of operation is not permitted by allowing only one clock cycle to exit the second active power-down mode of operation;

wherein the second active power-down mode of operation is in compliance with an industry wide standard; and wherein one of the first or second active power-down modes of operation is selected by programming a register.

* * * * *

UNITED STATES PATENT AND TRADEMARK OFFICE
CERTIFICATE OF CORRECTION

PATENT NO. : 7,411,857 B2 Page 1 of 1
APPLICATION NO. : 11/516848
DATED : August 12, 2008
INVENTOR(S) : Schaefer It is certified that error appears in the above-identified patent and that said Letters Patent is hereby corrected as shown below:

In column 6, line 2, in Claim 3, delete "adapted" and insert -- further configured to enable selection of a second power saving mode --, therefor.

In column 6, line 19, in Claim 5, delete "adapted" and insert -- configured --, therefor.

Signed and Sealed this

Twenty-eighth Day of October, 2008

JON W. DUDAS
*Director of the United States Patent and Trademark Office*